United States Patent [19]
Fujihara et al.

[11] Patent Number: 5,910,727
[45] Date of Patent: Jun. 8, 1999

[54] ELECTRICAL INSPECTING APPARATUS WITH VENTILATION SYSTEM

[75] Inventors: Kaoru Fujihara; Motohiro Kuji, both of Yamanashi-ken, Japan

[73] Assignee: Tokyo Electron Limited, Tokyo, Japan

[21] Appl. No.: 08/754,767

[22] Filed: Nov. 20, 1996

[30] Foreign Application Priority Data

Nov. 30, 1995 [JP] Japan ...................................... 7-338230
Nov. 30, 1995 [JP] Japan ...................................... 7-338231

[51] Int. Cl.⁶ .................................................. G01R 31/26
[52] U.S. Cl. ........................................ 324/158.1; 324/765
[58] Field of Search ................................ 324/765, 158.1, 324/754

[56] References Cited

U.S. PATENT DOCUMENTS

| | | | |
|---|---|---|---|
| 4,770,680 | 9/1988 | Machida et al. | 55/385.1 |
| 4,888,549 | 12/1989 | Wilson et al. | 324/73.1 |
| 5,429,642 | 7/1995 | Ohkuma | 29/25.01 |
| 5,451,884 | 9/1995 | Sauerland | 324/760 |
| 5,473,258 | 12/1995 | Abe | 324/754 |

FOREIGN PATENT DOCUMENTS

| | | |
|---|---|---|
| 63-151036 | 6/1988 | Japan . |
| 3-286544 | 12/1991 | Japan . |
| 4-24935 | 1/1992 | Japan . |
| 5-36766 | 2/1993 | Japan . |
| 5-41418 | 2/1993 | Japan . |

*Primary Examiner*—Glenn W. Brown
*Attorney, Agent, or Firm*—Oblon, Spivak, McClelland, Maier & Neustadt, P.C.

[57] ABSTRACT

An electrical inspecting apparatus includes an apparatus body having a housing section for housing a cassette in which a plurality of wafers are housed, an inspecting section provided with probes for applying an electrical inspection to the wafer, and a transfer section provided with a transfer arm for transferring the wafer between the housing section and the inspecting section. The housing section, inspecting section and transfer section are arranged side by side within the apparatus body, fan filters are mounted on the apparatus body for blowing air in a lateral direction through the housing section, inspecting section and transfer section, and an exhaust duct is mounted on the apparatus body for discharging the air flowing through the sections to the outside of the apparatus body.

15 Claims, 15 Drawing Sheets

FIG. I

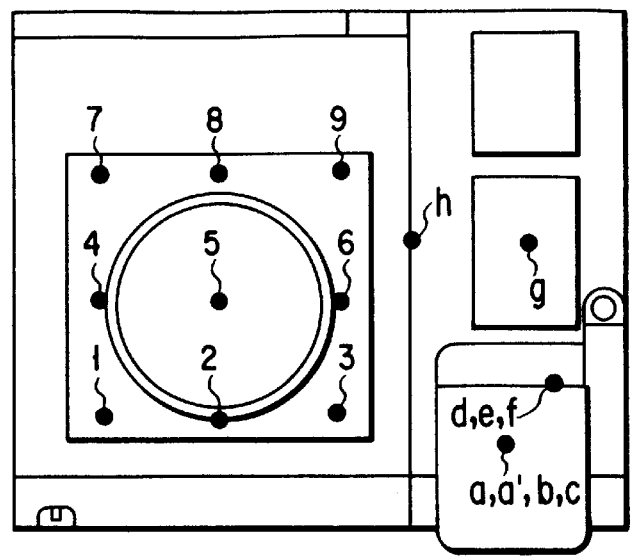
F I G. 12A
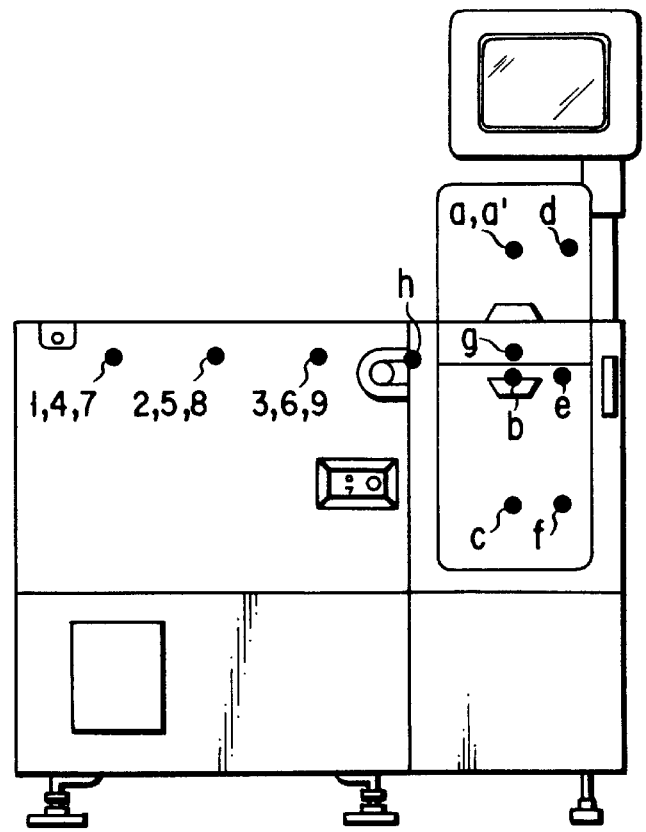
F I G. 12B

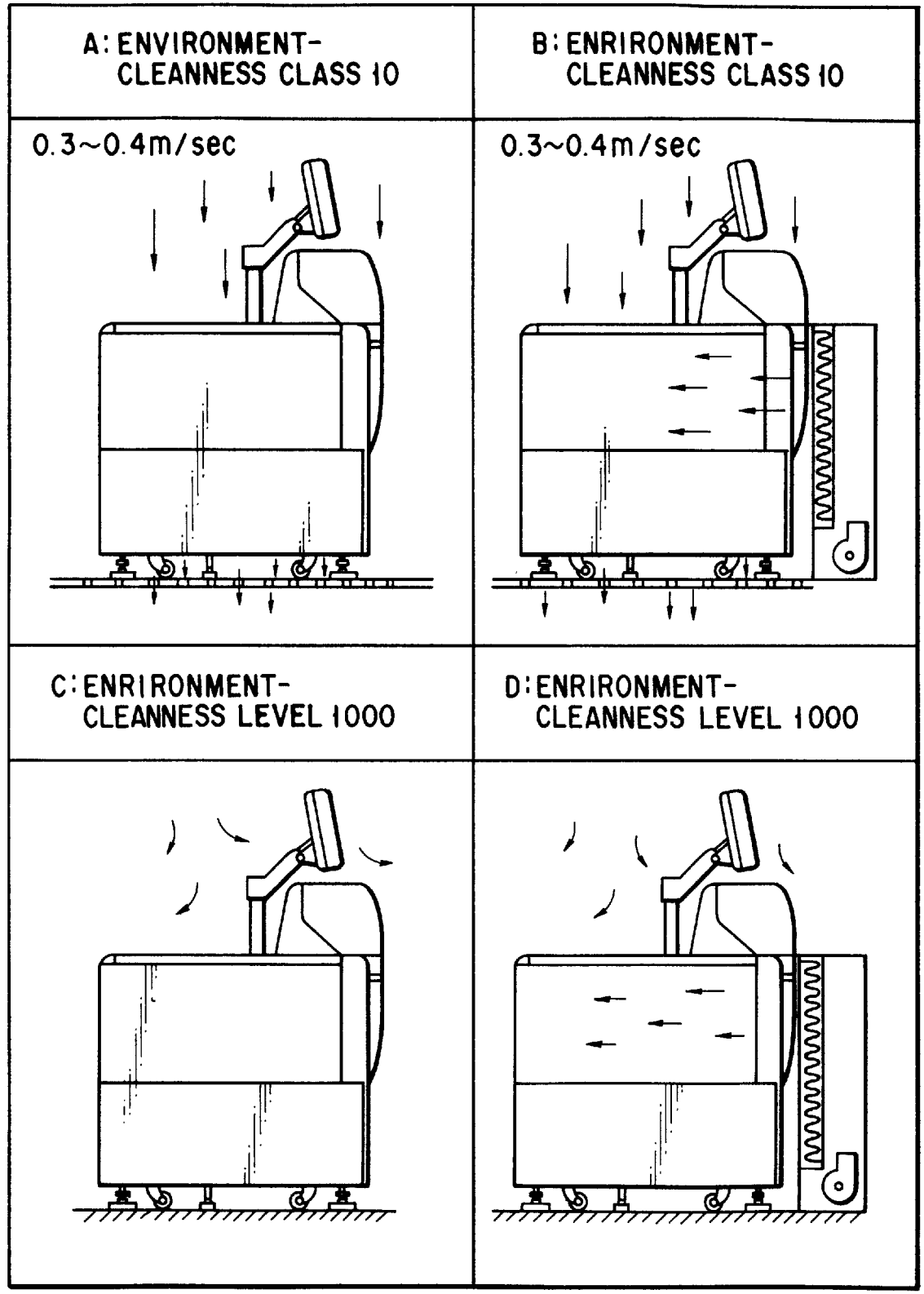
F I G. 13

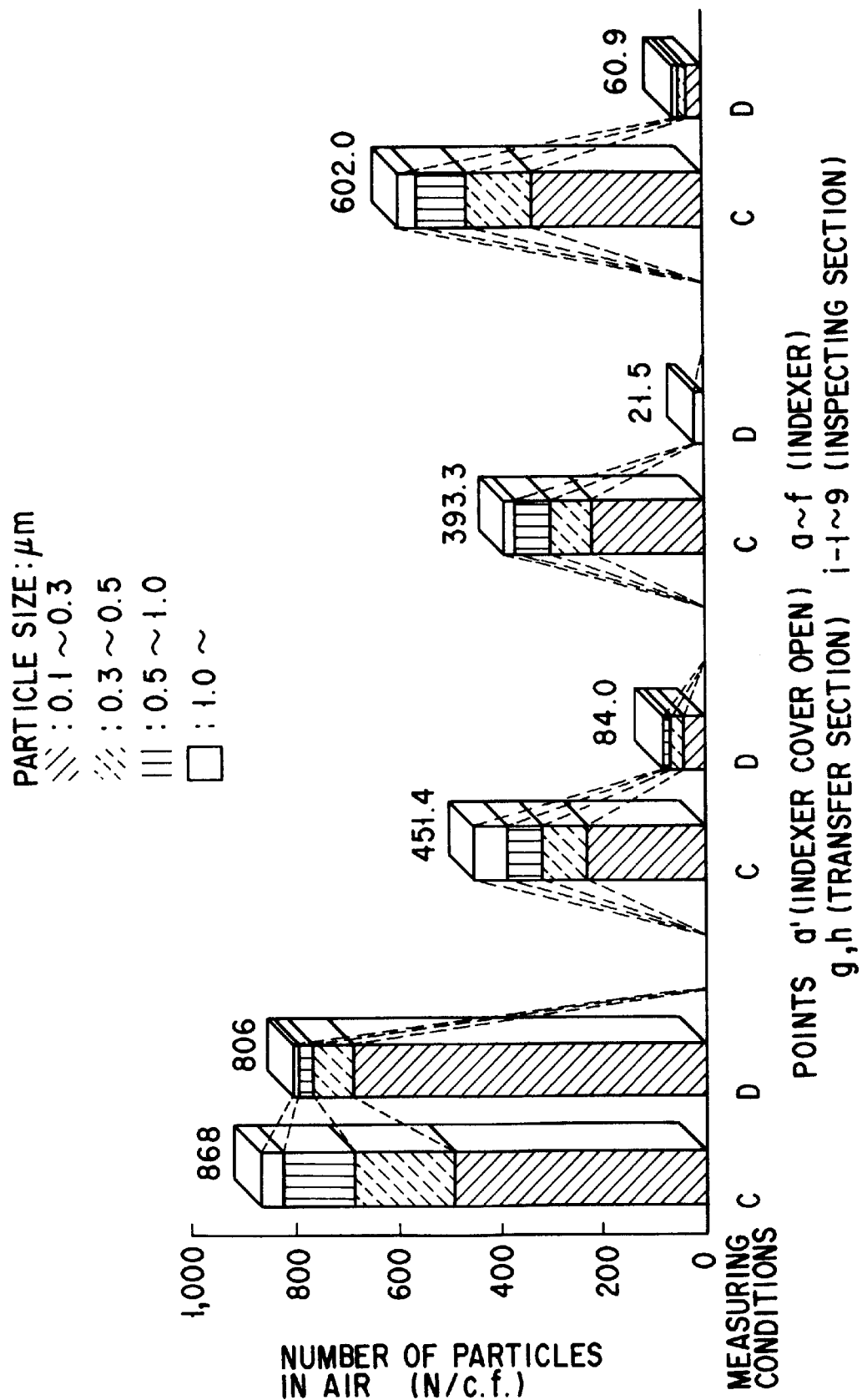
F I G. 15

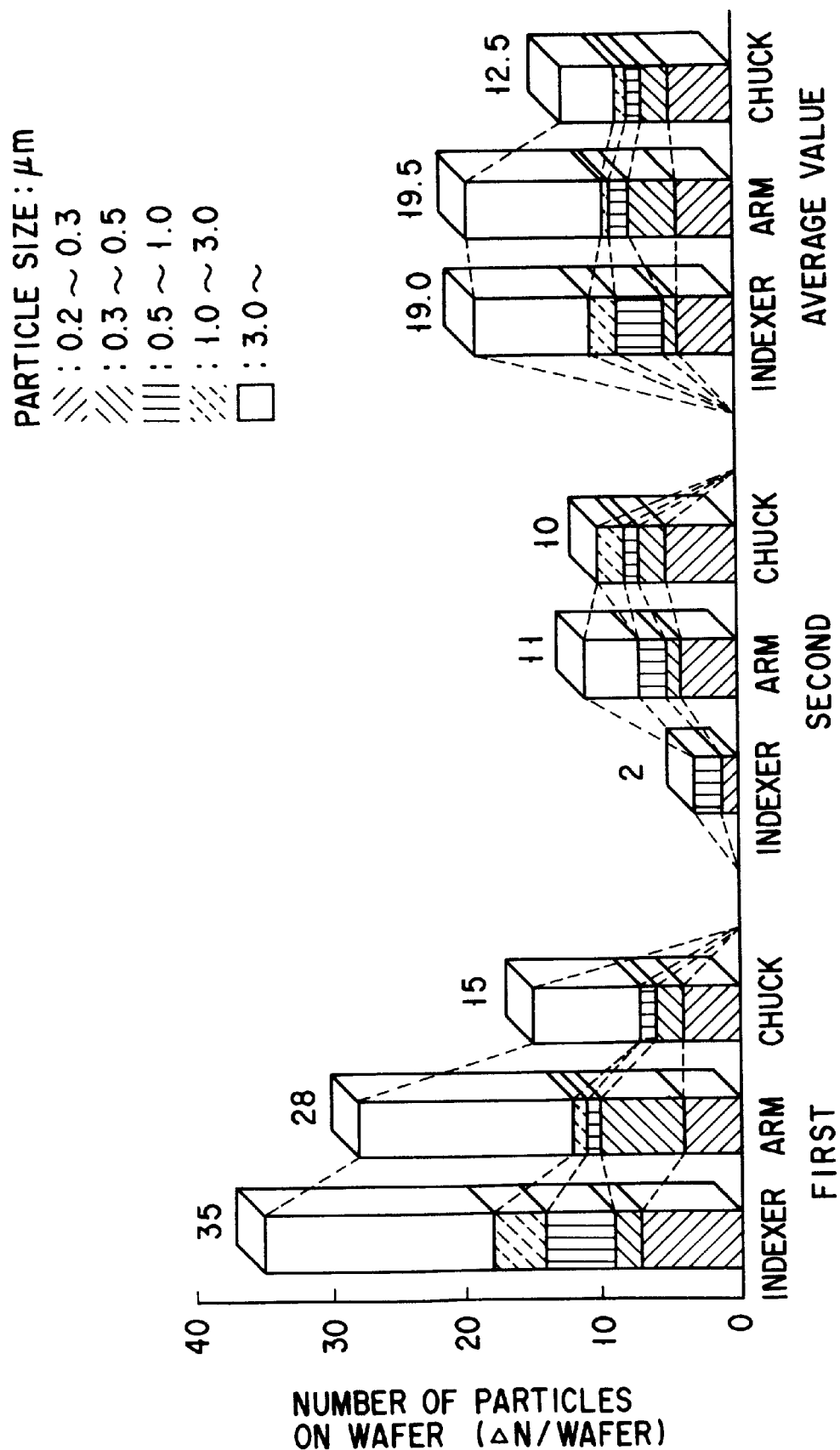
F I G. 16A

# ELECTRICAL INSPECTING APPARATUS WITH VENTILATION SYSTEM

BACKGROUND OF THE INVENTION

1. Field of the Invention

The present invention relates to an inspecting apparatus for electrically inspecting an object such as a semiconductor wafer, particularly, to an inspecting apparatus into which air is blown for improving the cleanliness.

2. Description of the Related Art

The conventional inspecting apparatus comprises in general a housing section for housing an object such as semiconductor wafers transferred in units of cassettes, a transfer mechanism arranged rearward of the housing section having forks or arms for transferring the object within the cassette, a table for receiving the object transferred by the transfer mechanism, and an electrical inspecting mechanism constructed by, for example, a probe card and a tester, said probe card serving to bring contactors such as probes into contact with the object on the table for electrical inspection of the object. For performing an electrical inspection, the object is taken out of the cassette by the fork for prealignment, followed by transferring the object onto the table by using the fork. Then, the table is moved in X-, Y- and θ-directions for locating the object in an inspecting position. Further, the table is over-driven in a Z-direction so as to bring the object into contact with the contactors. As a result, the object is allowed to receive a signal emitted from the tester for a predetermined electrical inspection.

It was customary in the past to use the inspecting apparatus for an electrical inspection of an integrated circuit formed in the preliminary steps such as a film-forming step and an etching step. Therefore, particles are less likely to offer problems during the inspection than in the preliminary steps. Nevertheless, it is desirable to apply an electrical inspection to the object under a particle-free environment in which particle generation is suppressed substantially completely. However, the presence of a transfer mechanism, driving mechanism of a table, etc. within the inspecting apparatus makes it unavoidable for particles such as dust to be generated, though the particle generation is very small. An inspecting apparatus which is intended to overcome this difficulty is proposed in each of, for example, Japanese Patent Disclosure (Kokai) No. 63-151036, Japanese Patent Disclosure No. 4-24935, Japanese Patent Disclosure No. 5-36766, and Japanese Patent Disclosure No. 5-41418. Specifically, the inspecting apparatus proposed in these publications comprises an exhaust fan or the like to cause the air within the apparatus body to flow downward so as to discharge the particles to the outside and to prevent heat accumulation within the apparatus body.

As described above, the inspecting apparatus is used generally for applying an electrical inspection to an object having an integrated circuit formed on the surface thereof. However, there are inspecting apparatuses which are used in a special fashion. For example, objects processed in preliminary steps are sampled and, then, inspected in some cases including an initial operation of a newly constructed plant for manufacturing semiconductor devices in order to inspect whether the apparatus used in each preliminary step performs its function as desired before full operation of the semiconductor manufacturing plant. In such a case, the object after inspection performed by using the inspecting apparatus must be brought back to the preceding step for the subsequent processings. It follows that, if particles are attached to the object brought back to the preceding step, it is impossible to evaluate accurately the subsequent process steps. Naturally, it is necessary to take special measures against particles when it comes to the inspecting apparatus used in a special fashion. To meet this requirement, proposed is an inspecting apparatus which is constructed such that a down stream of air is formed within the apparatus body so as to prevent the particles within the apparatus body from being attached to the object. Incidentally, the term "particles" noted above denotes the floating particles such as dust, which are generated from rubbish, metals, organic materials and human body.

However, in the conventional inspecting apparatus constructed such that a down stream of air is formed within the apparatus body, the particles are discharged together with the down stream of air to the outside through a bottom region of the apparatus body. In this case, the apparatus is constructed such that members of the apparatus such as the cassette, forks and table occupy most of the horizontal area within the apparatus body. It follows that a smooth down flow of the air stream is prevented by these members, giving rise to turbulence of the air. As a result, the particles are scattered over the entire region of the apparatus body, making it impossible to remove effectively the particles from within the apparatus body. What should also be noted is that the scattered particles are attached again to the object. It follows that it is impossible to solve satisfactorily the problem of the particle attachment to the object.

SUMMARY OF THE INVENTION

An object of the present invention is to provide an inspecting apparatus of a high cleanliness, which permits effectively removing floating particles, even if generated within or brought into an apparatus body, from within the apparatus body and also permits preventing the particles from being attached to an object to be inspected.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 9A to 9C collectively show a wafer chuck, in which FIG. 9A is an oblique view, FIG. 9B is a partial cross sectional view, and FIG. 9C is a front view;

FIGS. 11A and 11B collectively show a wafer chuck which can be suitably used in the inspecting apparatus of the present invention, in which FIG. 11A is a side view, partly broken away, and FIG. 11B is a schematic plan view;

FIGS. 12A and 12B relate to particle measurement, in which FIG. 12A is a plan view showing the horizontal position of the particle measuring point, and FIG. 12B is a front view showing the height position of the particle measuring point;

FIG. 13 are views showing the installing conditions A to D of the inspecting apparatus of the present invention and the conventional inspecting apparatus covering the case of measuring particles;

FIG. 15 is a graph showing the results of measurement of particles within air stream under installing conditions C and D shown in FIG. 13;

FIGS. 16A and 16B show the results of particle measurement, in which FIG. 16A is a graph showing the result of measurement of particles attached to semiconductor wafers left in the sections of installing condition A shown in FIG. 13, and FIG. 16B is a graph showing the result of measurement of particles attached to semiconductor wafers left in the sections of installing condition B shown in FIG. 13;

DETAILED DESCRIPTION OF THE PREFERRED EMBODIMENTS

Figure 1:
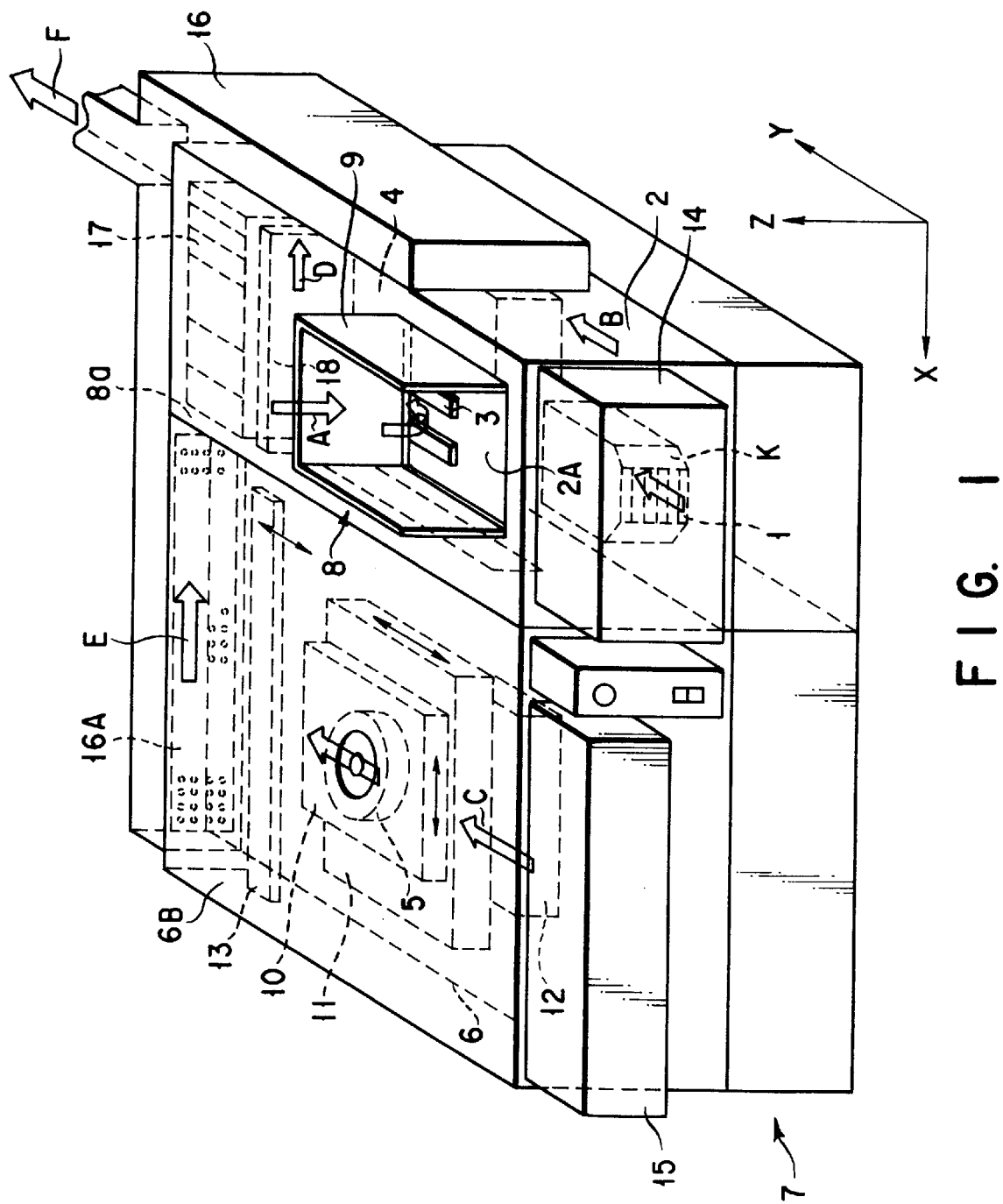
FIG. 1 is an oblique view showing an inspecting apparatus according to one embodiment of the present invention.

Let us describe an electrical inspecting apparatus of the present invention with reference to the accompanying drawings. As shown in FIG. 1, the inspecting apparatus, which is installed within a clean room, comprises a housing section 2 for housing a cassette K open in its front and rear ends, a transfer section 4 arranged rearward of the housing section 2, and an inspecting section 6. Objects to be inspected, e.g., 25 semiconductor wafers 1, are housed in the cassette K. The semiconductor wafers 1 (object) are transferred by a transfer mechanism, e.g., a pair of upper and lower arms or forks 3, within the transfer section 4 so as to be mounted on wafer chuck 5 arranged within the inspecting section 6. Further, a plurality of contactors such as probes (not shown) arranged within the inspecting section 6 are brought into contact with the pads of an IC formed on the semiconductor wafer 1 on the wafer chuck 5 for an electrical inspection of the wafer 1. These sections 2, 4 and 6 are arranged substantially flush with each other within an apparatus body 7. It should be noted that the housing section 2 and the transfer section 4 are housed in a rectangular housing 8 made of a plastic material such as a transparent acrylic sheet, and are separated from the inspecting section 6 by a partition plate 8a constituting one side wall of the housing 8. In this embodiment, the inspecting section 6 is covered with, for example, an openable lid 6B. However, the lid 6B may be omitted.

The driving mechanisms for the transfer arms 3, wafer chuck 5, etc. are driven in a known fashion under control by a control device (not shown).

An indexer (not shown) for supporting the cassette is arranged movable in a vertical direction within the housing section 2. At the position where the indexer is moved upward by a predetermined distance under control by the control device, the semiconductor wafer 1 before inspection is taken out of the cassette K by the upper arm 3 and, then, transferred to the wafer chuck 5. After inspection on the chuck 5, the semiconductor wafer 1 is put in the cassette K by the lower arm 3. A rectangular open portion 2A is formed in the upper wall of the housing 8 such that the open portion 2A is positioned above the housing section 2. Further, a partition 9 is arranged on the upper wall of the housing 8 in a manner to surround the open portion 2A except the front end in FIG. 1 and the upper end so as to form an air introducing member. A down stream of air is introduced through the partition 9 and the open portion 2A into the housing section 2 within the housing 8, as denoted by an arrow A in FIG. 1. Where the cassette K is disposed on the indexer positioned in the highest point, the partition 9 is allowed to surround the cassette K except the front face.

The arms 3 within the transfer section 4, said arms being formed movable on a horizontal plane and rotatable in a θ direction, serve to put or take the semiconductor wafer 1 in or out of the cassette K. Also, the arms 3 serve to transfer the wafer 1 to and from the wafer chuck 5 within the adjacent inspecting section 6. Further, a subchuck (not shown) is arranged within the transfer section 4. The wafer 1 taken out by the arm 3 is disposed on the subchuck for prealignment immediately before transfer of the wafer 1 into the inspecting section 6.

The wafer chuck 5, which is constructed movable in a vertical direction and rotatable in a θ direction, is arranged on an X-table 10. The X-table 10 is arranged on a Y-table 11 so as to be capable of a reciprocating movement in an X-direction. Further, the Y-table 11 is arranged on a substrate 12 so as to be capable of a reciprocating movement in a Y-direction.

An alignment bridge 13 constituting an alignment mechanism is provided within the inspecting section 6. The alignment bridge 13 is capable of movement above the wafer chuck 5 in the right-left direction and also capable of a reciprocating movement in the front-rear direction. When the semiconductor wafer 1 is disposed on the wafer chuck 5, the alignment bridge 13 is moved forward above the wafer chuck 5 such that the semiconductor wafer 1 is brought to a predetermined inspecting position by using, for example, a CCD camera (not shown) while the wafer chuck 5 is moved in X-, Y- and θ directions.

A probe card 6a provided with a plurality of contactors such as probes, which are electrically connected to a tester, is arranged above the chuck 5 within the inspecting section 6. The probe card 6a may be supported by a support member movable to a desired position above the chuck 5 so as to be arranged above the chuck 5. Alternatively, where the lid 6B is arranged on the inspecting section 6 as described previously, it is possible to mount the probe card 6a in a circular opening formed in the upper wall of the lid 6B. When an electrical inspection is applied to the semiconductor wafer 1, the chuck 5 is moved upward so as to bring the electrodes or pads of the semiconductor element included in the wafer 1 into contact with the contactors such as probes of the probe card 6a. Under this condition, the electrical state of the semiconductor element is measured by a tester.

As shown in FIG. 1, first and second fan filter units (FFU's) 14 and 15 acting as first and second air blowing means, respectively, are arranged horizontally side by side in a front region of an apparatus body 7. The air blowing ports of these FFU's 14 and 15 face the housing section 2 and the inspecting section 6, respectively, such that substantially horizontal air streams are formed to flow in a Y-direction toward the rear side in these sections 2 and 6, as denoted by arrows B and C. These FFU's 14 and 15 are assembled by the same constituting members.

An exhaust duct 16 is arranged to cover the rear and right-hand sides of the apparatus body 7 in a height substantially equal to that of any of these FFU's 14 and 15. As apparent from the drawing, the exhaust duct 16 constitutes an exhaust means for discharging the horizontal air streams denoted by arrows B and C to the outside of the apparatus body 7. To be more specific, an exhaust fan is arranged within the exhaust means to discharge the horizontal air streams within the apparatus body 7 to the outside through the exhaust duct 16.

Figure 2:
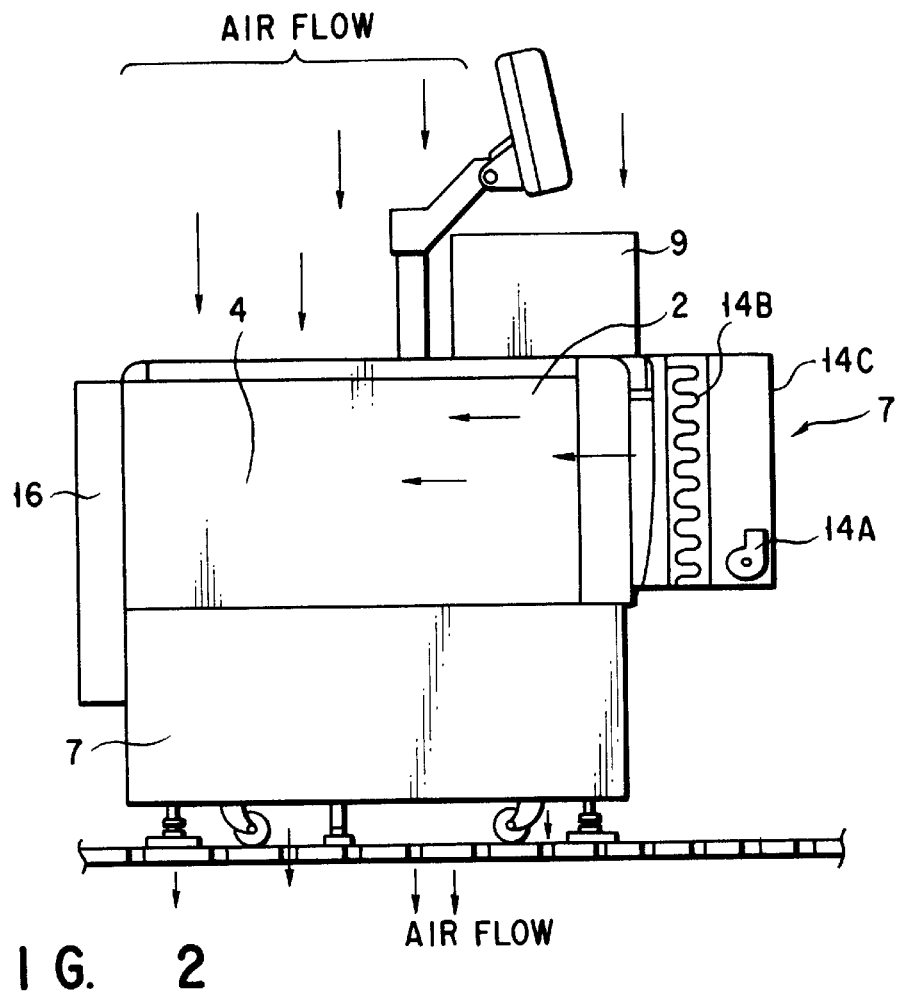
FIG. 2 is a view showing an air stream formed within the inspecting apparatus shown in FIG. 1.

As shown in, for example, FIG. 2, the first FFU 14 comprises a blower 14A for blowing the air upward, a filter, e.g., a ULPA (Ultra Low Penetration Air) filter 14B, arranged in front of the housing section 2, and a casing 14C mounted to the apparatus body 7 for housing these blower 14A and ULPA filter 14B. The dust contained in the air blown from the blower 14A is removed by the ULPA filter 14B. Then, the air having the dust removed therefrom forms a so-called "side stream of air" flowing on a horizontal plane from the forward region of the housing section 2 toward the backward region of the transfer section 4.

The second FFU 15 also comprises a blower, a ULPA filter and a casing so as to form an air side stream extending from the forward region toward the backward region of the inspecting section 6, like the first FFU 14. The flowing speed of the air streams formed by each of these first and second FFU's 14 and 15 is controlled by a control device to be adapted for the particle removal, e.g., 0.3 to 0.5 m/sec. The flowing speed of the air stream flowing through the housing section 2 and the transfer section 4 may be the same as or different from that of the air stream flowing through the inspecting section 6, though, in this embodiment, the flowing speed within the inspecting section 6 is set higher than that within the housing section 2 and the transfer section 4. Openings (not shown) into which flows the air stream after the dust removal are formed through the front walls of the housing 8 and the lid 6B. The air streams alone are shown in FIG. 2, omitting the internal constituting members.

The exhaust duct 16 is formed in substantially an L-shape. Specifically, the duct 16 extends from the right-hand side wall of the housing section 2 and, then, is curved to cover the entire back walls of the transfer section 4 and the inspecting section 6. The partition wall between the exhaust duct 16 and the apparatus body 7 is formed by, for example, a punched plate 16A. It follows that the horizontal air streams are discharged through the punched plate 16A to the outside in the directions denoted by arrows D, E and F. The air having the dust removed therefrom and blown into the housing section 2 flows through the cassette K and is combined with air flowing through the partition 9. The combined air stream is discharged to the outside through the punched plate positioned on the right-hand wall of the transfer section and, then, through the exhaust duct 16. The exhaust air stream flows from the inspecting section 6 to pass through the punched plate 16A so as to be combined with the exhaust air stream flowing within the exhaust duct 16. Further, the combined exhaust air stream is discharged to the outside of the apparatus body 7, as denoted by an arrow F. Where the inspecting apparatus is used within a clean room, the exhaust duct 16 may be joined to another exhaust duct extending outside the clean room so as to discharge the exhaust air to the outside of the clean room. Alternatively, the air used for removing the particles within the inspecting apparatus may be allowed to flow through a first and/or second FFU filters and/or a filter arranged separately so as to remove the particles from the air stream. In this case, the air stream having the particles removed therefrom is recycled into the apparatus body 7 for reuse.

Figure 3:
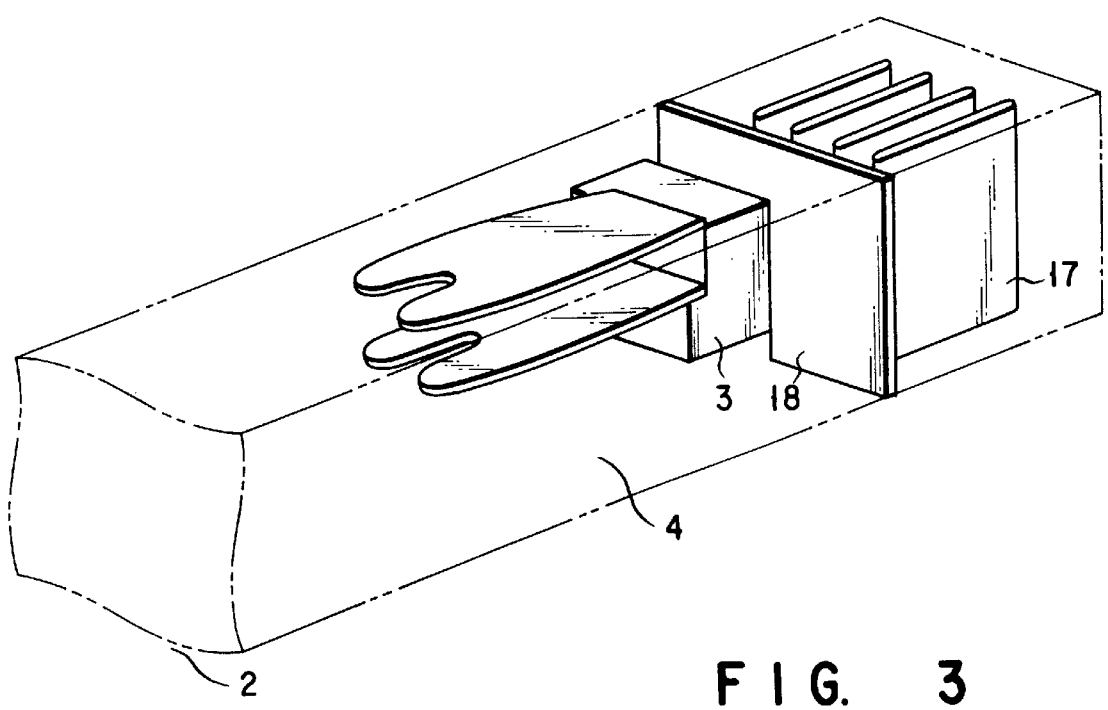
FIG. 3 is an oblique view showing a portion of the transfer section included in the inspecting apparatus shown in FIG. 1.

As shown in FIG. 3, a separating plate 18 for separating the transfer arms 3 from a board 17 is arranged behind the arms 3. The air stream flowing within the transfer section 4 is curved by the separating plate 18 to the right so as to flow into the exhaust duct 16. As a result, a heat convection accompanying the heat generation from the board 17 is suppressed. At the same time, the particles generated from the board 17 are prevented from being attached to the semiconductor wafer 1.

Figure 4:
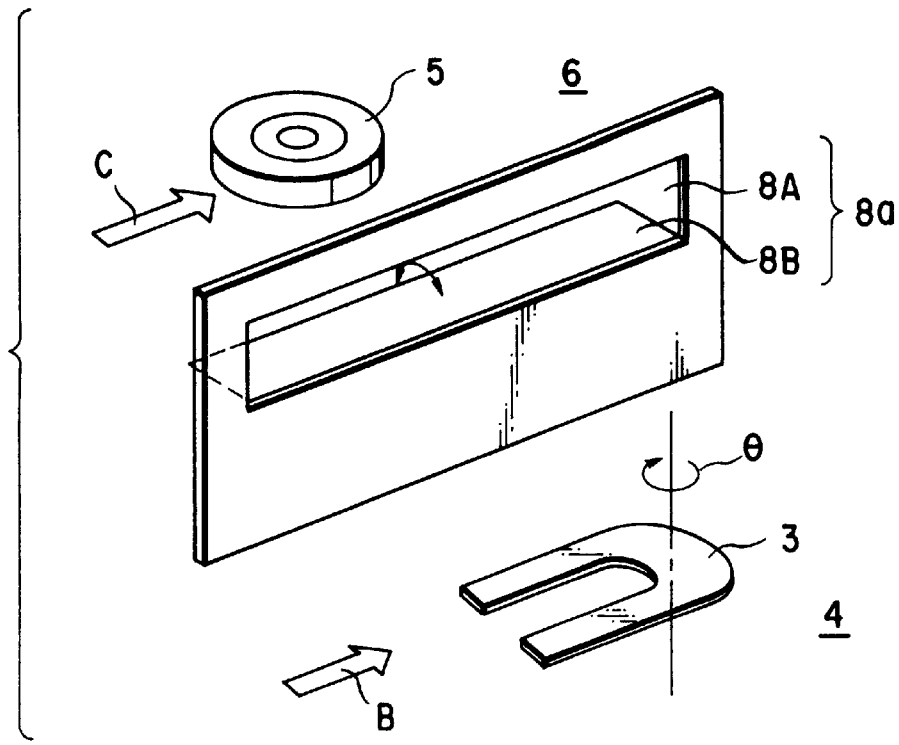
FIG. 4 is an oblique view showing a partition plate for partitioning the inspecting section from the housing section and transfer section included in the inspecting apparatus shown in FIG. 1.

As shown in FIG. 4, an oblong opening 8A is formed in the partition plate 8a for partitioning the inspecting section 6 from the housing section 2 and the transfer section 4. The semiconductor wafer 1 is transferred to and from the wafer chuck 5 by the arms 3 through the oblong opening 8A. A lower end portion of an oblong plate is hinged to, for example, the bottom wall of the opening 8A so as to form a door 8B swingable about the hinged portion as denoted by an arrow. Only when the semiconductor wafer 1 is transferred by the arm 3 to and from the wafer chuck 5, the door 8B is opened by a driving mechanism such as an air cylinder under control by a control device. It follows that, when the semiconductor wafer 1 is not transferred by the arm 3 to or from the wafer chuck 5, the door 8B is closed so as to partition the inspecting section 6 from the housing section 2 and the transfer section 4. In this case, the air streams on both sides of the partition plate 8a can be controlled independently.

Figure 5:
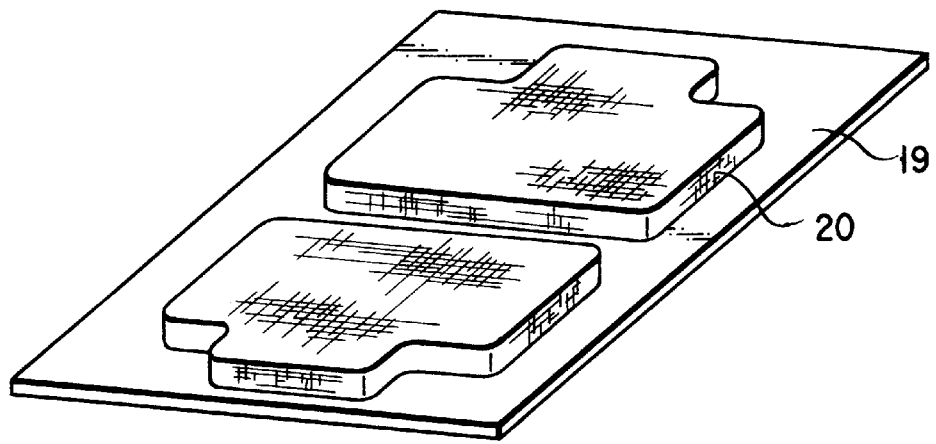
FIG. 5 is an oblique view showing the bottom plate of the inspecting section included in the inspecting apparatus shown in FIG. 1.

As shown in FIG. 5, a thin filter 20 having a thickness of, for example, 35 mm such as a HEPA (High Efficiency Particulate Air-filter) is mounted in an open portion formed in a bottom plate 19 of the inspecting section 6. The particles are removed by the HEPA filter 20 from the down stream of the air disturbed by the intervening members such as the wafer chuck 5 and, then, discharged into the clean room through a duct. The HEPA filter 20, which permits a low pressure loss, is formed of, for example, $SiO_2$ fibers.

Figure 6:
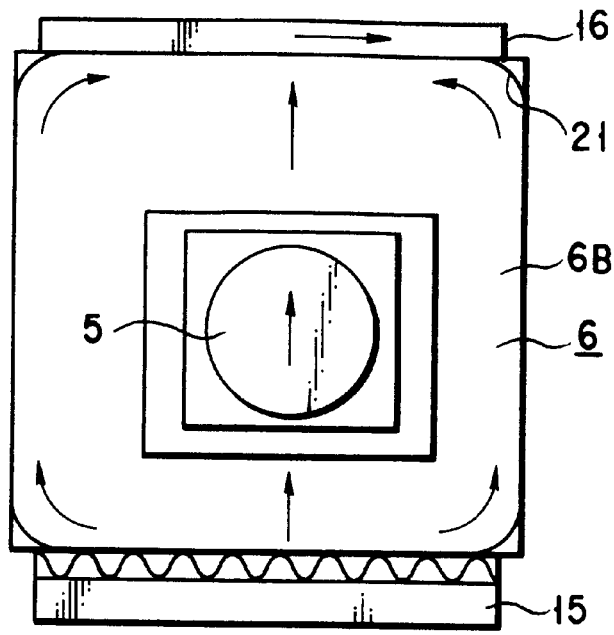
FIG. 6 is a plan view schematically showing the inspecting section included in the inspecting apparatus shown in FIG. 1.

As shown in FIG. 6, the four corner portions of the inspecting section 6, i.e., angular portions inside the lid 6B, are made roundish on a horizontal plane to form roundish portions 21. As a result, the side stream of the air is allowed to flow smoothly along the inner surface of the inspecting section 6, making it possible to prevent the particles from staying in the corner portions. Incidentally, the corner portions of the housing 8 covering the housing section 2 and the transfer section 4 are also made roundish, though these roundish portions cannot be seen in the drawings.

Figure 7:
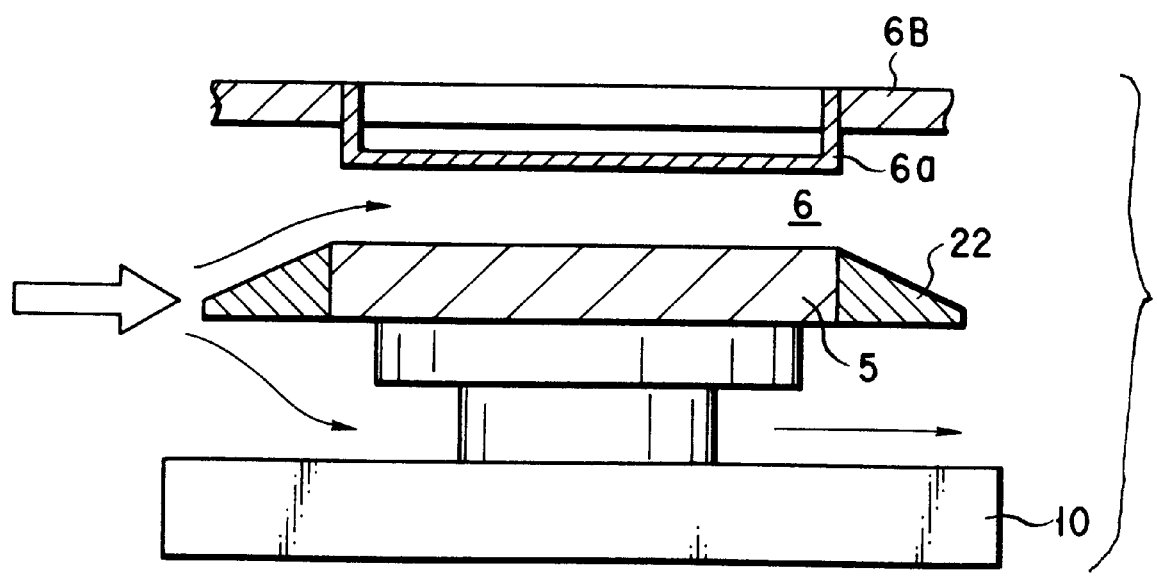
FIG. 7 is a partial cross sectional view showing the wafer chuck included in the inspecting apparatus shown in FIG. 1.

Further, FIG. 7 shows that it is possible to mount, as required, a rectangular air flow-smoothing member 22, which is hollow and arranged to surround the wafer chuck 5. The thickness of the member 22 is gradually increased from the outermost periphery toward the innermost periphery. The air flow-smoothing member 22 permits a stratified side stream of air within the inspecting section 6 to flow smoothly toward the down stream side in spite of the presence of the wafer chuck 5. In other words, the member 22 prevents the air stream from being disturbed at the outer peripheral region of the wafer chuck 5, making it possible to suppress the scattering of the particles within the inspecting section 6.

The inspecting apparatus constructed as described above is operated as described below. In the first step, an operator disposes the cassette K on the indexer within the housing section 2. Then, if the blowers 14A, etc. of the first and second FFU's 14, 15 are driven, the air within the clean room is sucked by the blower 14A into the housing 14C. The floating particles are removed from the air introduced into the housing 14C by the ULPA filter 14B, etc. and, then, the resultant clean air is blown into the housing section 2 and the inspecting section 6 through the open portions thereof. Within the housing section 2, the indexer is moved in a vertical direction to reach a predetermined position. Then, the upper arm 3 is driven to take a predetermined semiconductor wafer 1 out of the cassette K. In this case, a side stream of air flowing from the front region toward the rear region is formed by the first FFU 14 within the housing section 2. The side stream flows to cross the cassette K in the front-rear direction within the housing section 2 and, then, flows into the transfer section 4 together with the air introduced from the clean room through the partition 9. The side stream flowing into the transfer section 4 crosses the transfer arms 3 in the front-rear direction so as to collide against the separating plate 18 behind the arms 3. It should be noted that the partition plate 8a on the left side of the transfer section 4 causes the flowing direction of the side stream to be change to the right, with the result that the side stream flows through the punched plate 16A into the exhaust duct 16.

It should be noted that, even if particles are generated in the driving mechanism of the transfer arms 3, etc., these particles are moved downstream of the semiconductor wafer 1 by the side stream of air. What should also be noted is that the side stream carrying the floating particles flows along the roundish corner portions in the housing section 2 and the transfer section 4, with the result that the particles do not stay within the transfer section 4 so as to be discharged into the exhaust duct 16.

As described above, the air stream within the housing section 2 and the transfer section 4 forms a side stream so as to appreciably suppress the disturbance of the side stream caused by the presence of the cassette K and the arms 3, with the result that the particles can be discharged smoothly into the exhaust duct 16. Further, particles derived from the operator may possibly enter the housing section 2 through the open portion 2A of the housing. Alternatively, particles may be generated by the driving of the transfer arms 3, etc. Even in these cases, however, these particles are carried by the side stream of air so as to be discharged into the exhaust duct 16 without being attached to the semiconductor wafer 1. It follows that these particles are prevented from staying within the housing section 2 and the transfer section 4. Under this condition, the door 8B of the partition plate 8a is opened so as to open the open portion 8A. Then, the wafer is transferred by the upper arm 3 from the cassette K into the inspecting section 6.

In this step, the wafer chuck 5 within the inspecting section 6 is already in a position to receive the semiconductor wafer 1. Therefore, if the upper arm 3 is rotated in a θ direction by 90° to change its position from the position facing the cassette K to the position facing the inspecting section 6 such that the upper arm 3 proceeds into the inspectinng section 6 through the open portion 8A of the partition plate 8a, the semiconductor wafer 1 is positioned right above the wafer chuck 5. In this step, the driving pins (not shown) of the wafer chuck 5 are moved upward so as to allow the wafer chuck 5 to receive the semiconductor wafer 1 from the upper arm 3.

When the wafer chuck 5 receives the semiconductor wafer 1, thereon a side stream of air flowing from the front region toward the rear region is formed by the second FFU 15 within the inspecting section 6. The side stream thus formed flows across the grasping means 3 and the wafer chuck 5 in the step of transferring the semiconductor wafer 1 so as to flow into the exhaust duct 16 through the punched plate 16A. It should be noted that the roundish corner portions 21 are formed in the inspecting section 6. As a result, the side stream flows along the roundish corner portions 21 so as to flow smoothly into the exhaust duct 16 without staying in the corner portions in the inspecting section 6. Further, where the air flow-smoothing member 22 is mounted to surround the outer circumferential surface of the wafer chuck 5 as shown in FIG. 7, the side stream is not disturbed in the upper and lower regions of the wafer chuck 5 so as to permit the side stream to flow smoothly along the surface of the semiconductor wafer 1.

Since a side stream of air is formed within the inspecting section 6 as described above, it is possible to diminish the resistance to the air flow provided by the wafer chuck 5 and the arms 3 because the vertical cross sectional area of these wafer chuck 5 and arms 3 is markedly smaller than the horizontal cross sectional area of these members. It follows that the disturbance of the side stream of air within the inspecting section 6 can be suppressed so as to permit the particles to be discharged smoothly into the exhaust duct 16. Also, even if particles are generated by the driving of, for example, the wafer chuck 5, these particles are carried by the side stream of air toward downstream of the semiconductor wafer 1. In addition, the roundish corner portions 21 of the housing section 2 and the transfer section 4 permit the side stream of air to flow smoothly, with the result that the particles are prevented from staying within the inspecting section 6, but are carried by the side stream of air into the exhaust duct 16 smoothly. Further, even if the side stream is disturbed by the resistance to the air flow provided by the wafer chuck 5, and X-, Y-tables 10, 11, the influence given by the turbulent air flow is alleviated because the air stream flows partly to the outside through the HEPA filter 19 formed in the bottom plate 18.

As described above, the inspecting apparatus of the present invention shown in FIGS. 1 to 7 comprises the first FFU 14 arranged in the front region of the housing section 2 for forming a side stream of air flowing from the housing section 2 toward the transfer section 4, and the second FFU 15 arranged in the front region of the inspecting section 6 for forming a side stream of air flowing from the front region to the rear region of the inspecting section 6. In addition, the exhaust duct 16 for discharging each of these side streams is arranged to cover the transfer section 4 and the inspecting section 6. It follows that the resistance areas of the resistors to the air stream such as the transfer arms 3 and the wafer chuck 5 can be diminished, making it possible to suppress the turbulent flow of the side stream. Therefore, even if particles are generated from the driving sections of the arms 3, wafer chuck 5, etc. within the apparatus body 7, these particles can be carried effectively from within the apparatus body 7 into the exhaust duct 16 by the side stream of air so as to improve effectively the cleanliness within the apparatus body 7. As a result, the particles can be prevented from being attached to the semiconductor wafer 1 after the inspection. Naturally, the inspecting apparatus of the present invention can also be used effectively for evaluation of the performance of various devices used in preliminary steps in the manufacture of the semiconductor device.

The inspecting apparatus of the present invention also comprises the partition plate 8a for partitioning the inspecting section 6 from the housing section 2 and the transfer section 4, making it possible to control separately the flow speed of the side stream flowing through the housing section 2 and, then, through the transfer section 4 and the flow speed of the side stream flowing through the inspecting section 6. In other words, the flow speed of each of the air streams within the apparatus body can be set at an optimum value independently.

Figure 8:
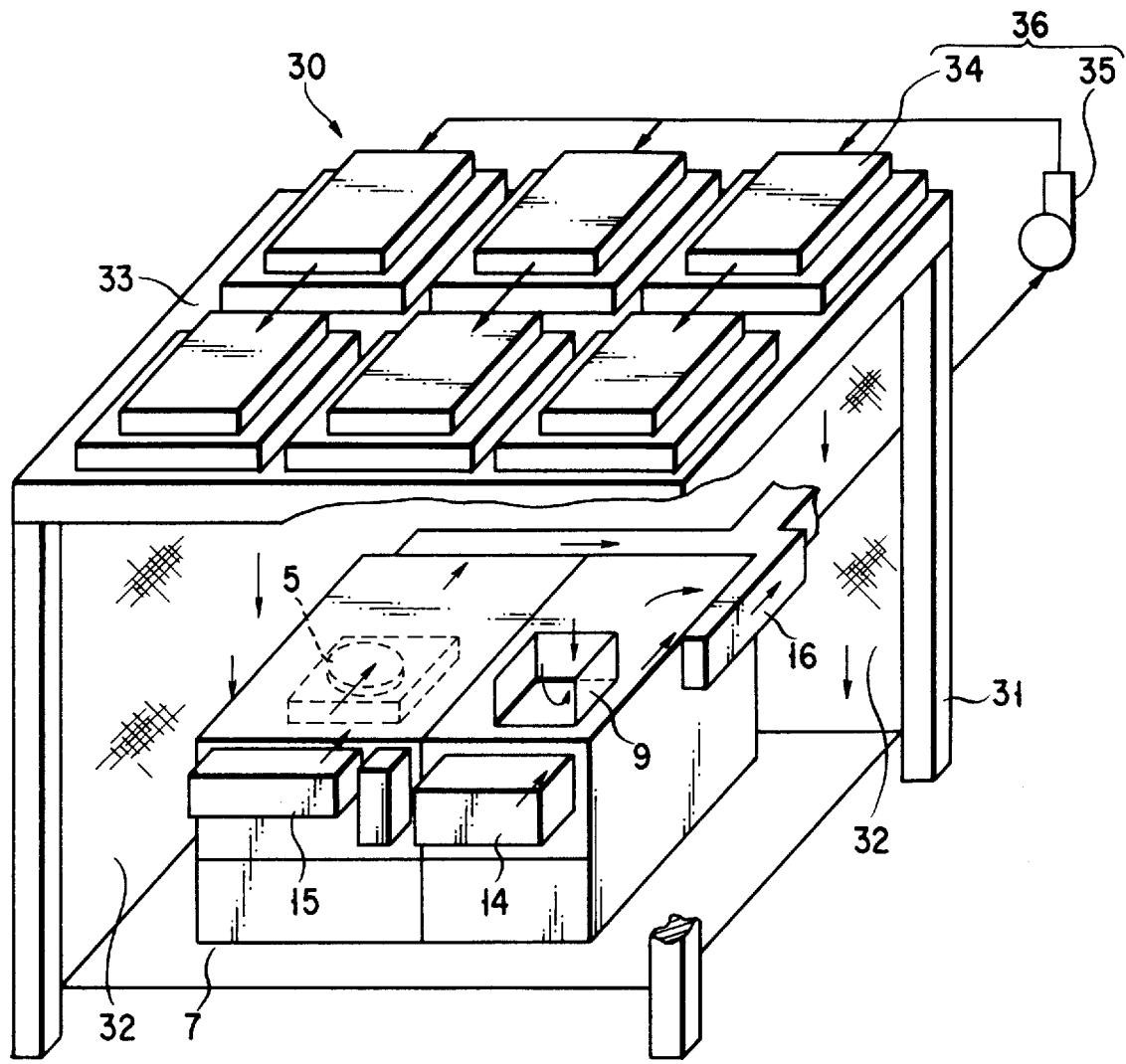
FIG. 8 is an oblique view showing an inspecting apparatus according to another embodiment of the present invention.

The inspecting apparatus of the present invention may be arranged within a clean booth 30 disposed within the clean room for removing particles so as to form a closed system. The particular construction permits improving more effectively the cleanliness within the apparatus body 7. As shown in FIG. 8, the clean booth 30 comprises a frame 31 surrounding the apparatus body 7, side plates 32 made of, for example, transparent acrylic sheets and arranged to surround the frame 31, and a ceiling 33 so as to keep the clean booth 30 substantially air-tight. A plurality of FFU's 34 are arranged on the ceiling 33. In the embodiment shown in FIG. 8, six FFU's 34 which are collectively connected to a blower 35 are arranged side by side. Of course, the air is blown by the blower 35 into each of the six FFU's 34. These FFU's 34 and blower 35 collectively form a third air-blowing means 36. In other words, a clean air can be supplied from above into the inspecting apparatus by the third air-blowing means 36. It should be noted that the clean booth 30 is designed to keep cleanliness of, for example, cleanness class 10.

The exhaust duct 16 included in the inspecting apparatus is joined to a suction duct of the blower 35 so as to circulate the air discharged from the apparatus body 7 for reuse.

A door (not shown) is formed in the side plate 32 on the front side of the apparatus body 7. When the semiconductor wafer 1 is put in or taken out of the apparatus body 7, the particular door is opened such that the cassette K is transferred into or out of the apparatus body 7 through the door. The inner pressure of the clean booth 30 is set somewhat higher, e.g., 0.2 to 0.3 mm $H_g$ higher, than the inner pressure of the clean room.

When the third air-blowing means 36 is driven together with driving of the first and second FFU's 14, 15 included in the inspecting apparatus, the air having the particles removed therefrom by the FFU 34 within the clean booth 30 flows downward from the ceiling 33 to form a down stream of air. The down stream thus formed is combined with the side stream, and the combined stream flows into the transfer section 4, as described previously. The function of the side stream is equal to that described previously and, thus, the description thereof is omitted.

Figure 9A:
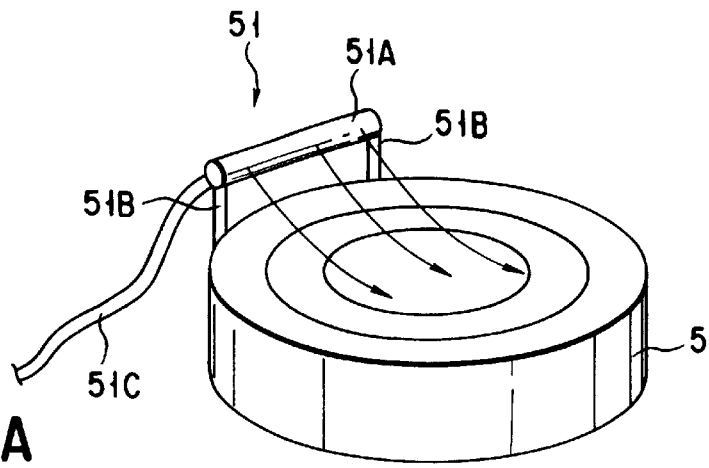
Figure 9B:
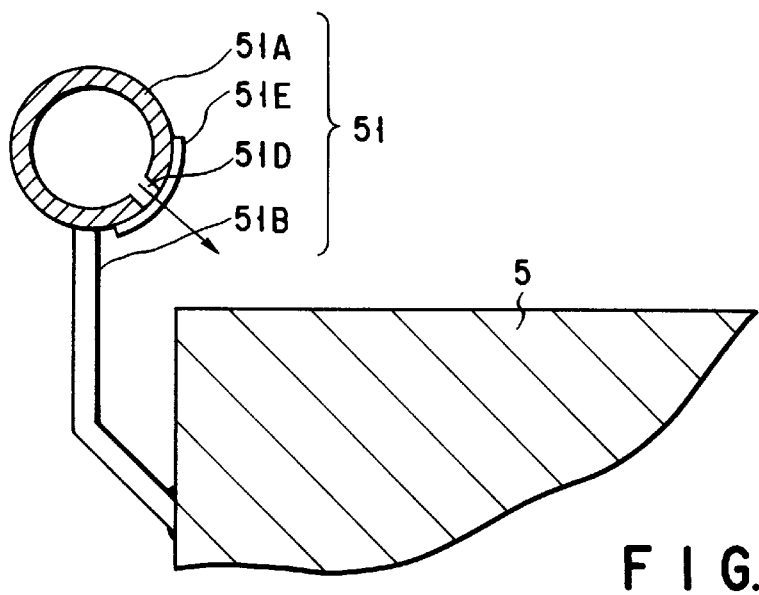
Figure 9C:
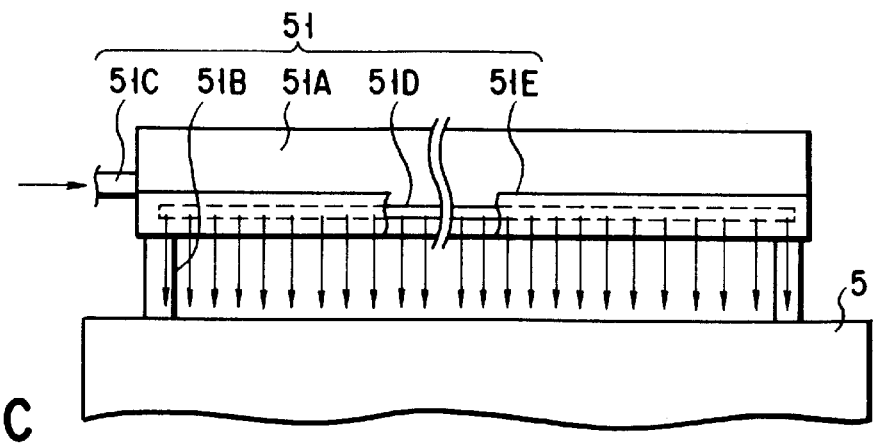

As described above, the inspecting apparatus shown in FIG. 8 comprises the clean booth 30 arranged to surround the apparatus body 7 of the inspecting apparatus. In addition, the third air-blowing means 36 serving to form a down stream of air flowing downward from the ceiling 33 of the clean booth 30 is arranged within the clean booth 30. As a result, it is possible to maintain the cleanness within the clean booth 30 higher than in the clean room. It is also possible to maintain a high cleanness of the air within the apparatus body 7. Further, the function and effect produced by the apparatus described previously in conjunction with FIGS. 1 to 7 can also be produced by the apparatus shown in FIG. 8. What should also be noted is that the inner pressure of the clean booth 30 is set somewhat higher than the inner pressure of the clean room, making it possible to prevent the air within the clean room from flowing into the clean booth 30. It follows that it is possible to maintain the cleanliness within the clean booth 30 at a cleanness class 10 regardless of the environment in which the inspecting apparatus is installed. Further, since the apparatus employs a closed system for circulating the air within the apparatus body 7, it is impossible for the particles, even if generated within the apparatus body 7, to be discharged into the clean room.

Where it is desired to ensure the effect of preventing the particles from being attached to the semiconductor wafer 1 in the inspecting step, an air blowing means 51 is added for blowing a clean air obliquely downward toward the upper surface of the wafer chuck 5, as shown in, for example, FIGS. 9A to 9C. The air blowing means 51 comprises a slender cylindrical body 51A having a closed end, fixed legs 51B for supporting the cylindrical body 51A in front of and above the chuck 5, and an air transfer pipe 51C having one end connected to the open end of the cylindrical body 51A. The other end of the air pipe 51C is connected to an air supply source (not shown). As shown in FIGS. 9B and 9C, a slit 51D is formed in the wall of the cylindrical body 51A to extend over substantially the entire length of the cylindrical body 51A. Further, a ULPA filter 51E is formed to cover partly the outer surface of the wall of the cylindrical body 51A such that the slit 51D is covered with the ULPA filter 51E. The slit 51D is formed slightly above the lowest position of the cylindrical body 51A on the side of the wafer chuck 5. As a result, the air having the particles removed therefrom by the ULPA filter 51E is emitted obliquely downward toward the upper surface of the wafer chuck 5 or toward the semiconductor wafer 1 disposed on the wafer chuck 5 so as to blow away the particles flowing along the surface of the chuck 5 (or the semiconductor wafer disposed on the chuck 5).

Figure 10:
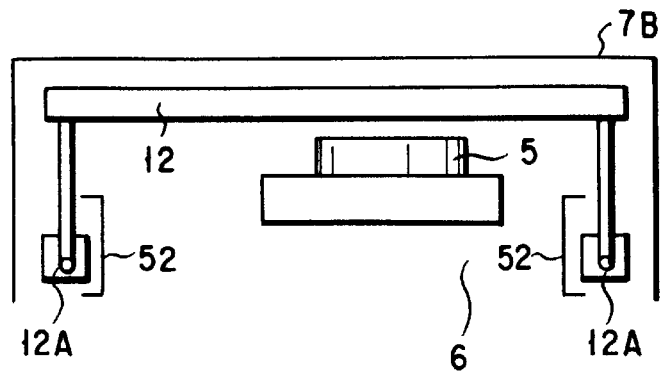
FIG. 10 is a front view showing an alignment mechanism which can be suitably used in the inspecting apparatus of the present invention.
Figure 11A:
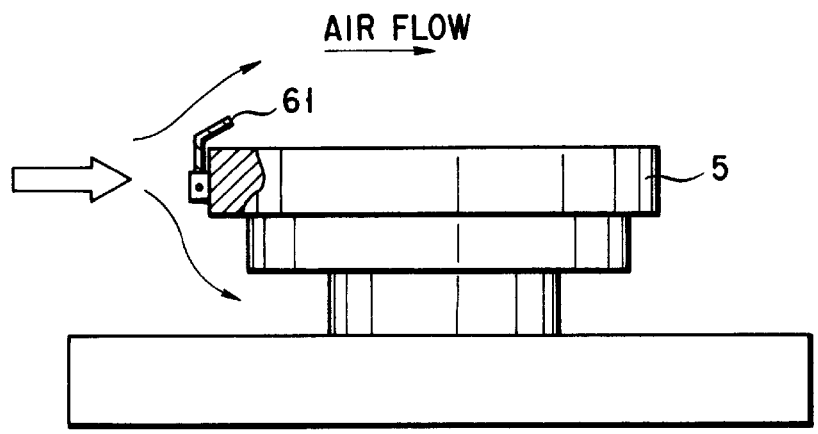
Figure 11B:
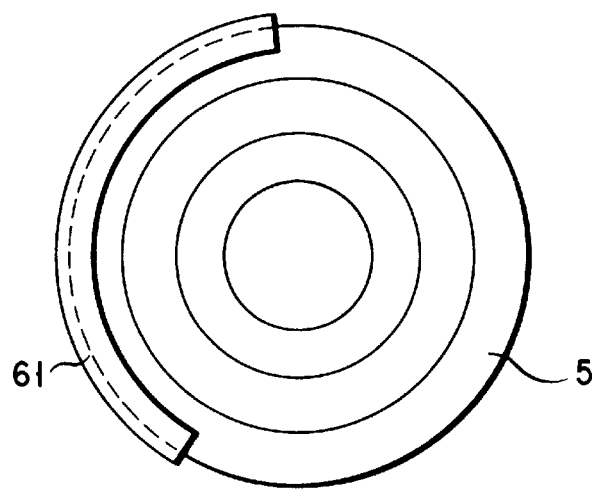

It is not absolutely necessary to mount the cylindrical body 51A directly to the wafer chuck 5. For example, it is possible to have the cylindrical body 51A supported by the lid 6B covering the inspecting section 6. Also, the position of the cylindrical body 51A need not be limited. However, it is desirable to mount the cylindrical body 51A to permit the air stream emitted therefrom to flow in the direction equal to that of the air stream blown from the second FFU 15 such that a turbulent flow may not be formed between these two air streams. To be more specific, it is desirable to mount the cylindrical body 51A to permit the slit 51D to extend in a direction denoted by X in FIG. 1. Alternatively, it is possible to mount a circular cylindrical body having an inner diameter slightly larger than that of the wafer chuck 5 in a manner to surround the chuck 5. In this case, the cylindrical body should be constructed to permit the air stream to be blown from the outside of the entire circumferential edge of the chuck 5 toward the chuck. It is also possible to form, in place of the slit 51D, a plurality of small holes or small slits in the wall of the cylindrical body 51A in a manner to extend in a longitudinal direction of the cylindrical body 51A. Further, the ULPA filter 51E may be formed to cover the entire circumferential region of the cylindrical body 51A. Alternatively, the ULPA filter 51E may be formed intermediate of the air transfer pipe 51C, not on the cylindrical body 51A.

Where it is desired to prevent the particles from being scattered from the particle generation source within the inspecting section 6, it is possible to arrange a cover 52 in a sliding region 12A such as a guide rail of the alignment bridge 12 within the inspecting section 6, as shown in FIG. 10. As apparent from the drawing, the cover 52 is effective for preventing the particles generated from the sliding region 12A from being scattered toward the wafer chuck 5. A similar measure can be taken for any of other sliding regions. Further, in order to prevent the particle generation, it is desirable to paste a tape made of a material which is unlikely to generate particles such as a tetrafluoride resin to the sliding section such as a cable bearing which receives a control cable for the wafer chuck 5.

Where a hot chuck for heating the semiconductor wafer 1 to a predetermined temperature for the electrical inspection thereof constitutes the wafer chuck 5, a temperature gradient tends to be formed in the semiconductor wafer 1 by the side stream of air flowing within the inspecting section 6, making it impossible to perform an accurate inspection at a predetermined temperature. In such a case, it is desirable to mount a windbreak cover 61 to the hot chuck 5 on the upstream side in the flowing direction of the side stream of air in a manner to extend upward from the upper surface of the chuck so as to prevent the air stream from blowing directly the semiconductor wafer 1 and, thus, to prevent a temperature gradient from being formed in the wafer 1.

In order to look into the effect of removing particles, a comparative test has been conducted between an inspecting apparatus of the present invention utilizing a side stream of air and a comparative apparatus in which a side stream of air is not employed. In this test, the number of particles within the air stream was measured in measuring points a to h within the housing section and transfer section and in measuring points 1 to 9 within the inspecting section of the apparatus shown in FIGS. 12A and 12B. It should be noted that FIG. 12A is a plan view showing the horizontal positions of these measuring points, with FIG. 12B, which is a front view, showing the height positions of these measuring points.

To be more specific, measured was the number of particles attached to a semiconductor wafer left in each section of the inspecting apparatus. FIG. 13 shows the measuring environments. Under the environments shown in FIG. 13, the number of particles was measured by using measuring instruments (a) to (c) given below:

(a) Laser particle counter: μLPC-110 (manufactured by PMS Inc.) ... Air was sucked at a rate of 1.0 ft$^3$/min, and the number of particles sized at least 0.1 μm was measured in a minute, this measurement was repeated twice, and the average value of two measured values was plotted as a measured value.

(b) Hot wire anemometer: Model 6521 (manufactured by Nippon Kanomax Inc.)

(c) Wafer surface defect detector: Surfscan 6200 (manufactured by Tencol Inc.) . . . The number of particles on the surface of the semiconductor wafer, said particles being sized at least 0.2 μm, was measured by means of an edge cut of 5 mm.

FIGS. 14 to 18 show the results of the measurement. It should be noted that letters A and C in FIGS. 13 to 15, 17 and 18 denote the installing conditions of the comparative inspecting apparatus. On the other hand, letters B and D in these drawings denote the installing conditions of the inspecting apparatus of the present invention. The comparative apparatus was prepared by mounting an exhaust fan on the back side of the apparatus body.

Figure 14:
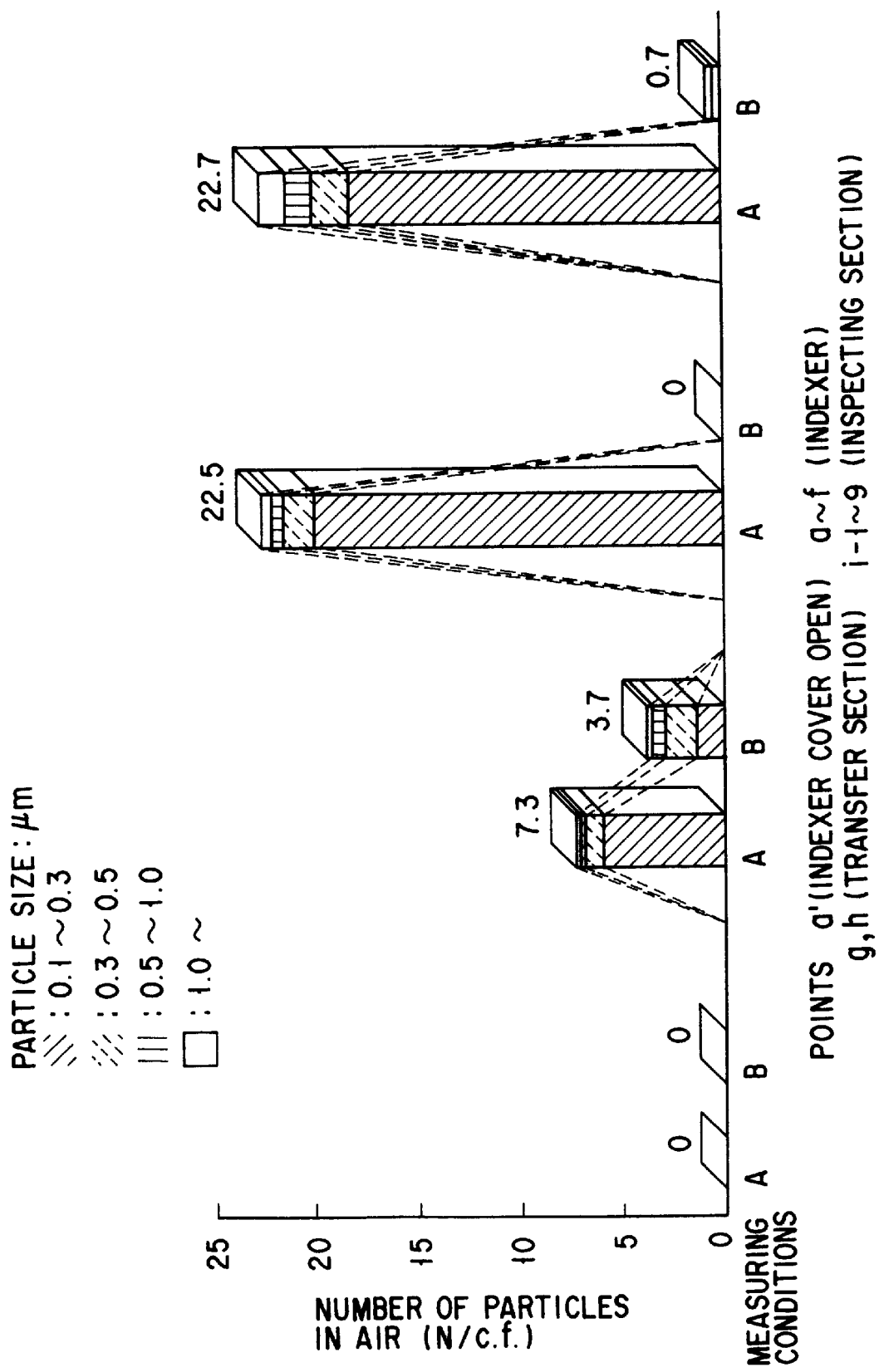
FIG. 14 is a graph showing the results of measurement of particles within air stream under installing conditions A and B shown in FIG. 13.

FIG. 14 is a graph showing the results of measuring the particles within the air stream in the measuring points shown in FIG. 12 under the installing conditions A (comparative apparatus) and B (apparatus of the present invention) shown in FIG. 13. As seen from the graph, particles were scarcely detected in any of the comparative apparatus and the apparatus of the present invention in the case where the cover of the indexer in the housing section was left open. However, the number of particles was found smaller in the apparatus (B) of the present invention, if the cover was closed. What should be noted is that a prominent difference in the number of particles was found between the comparative apparatus (A) and the apparatus (B) of the present invention when it comes to the transfer section and the inspecting section where there were the driving mechanisms for the grasping means, wafer chuck, etc. Specifically, the particles were found to have been discharged substantially completely from the apparatus of the present invention. On the other hand, the particles were unlikely to be discharged from the comparative apparatus (A) so as to cause a large number of particles to be left within the apparatus.

FIG. 15 is a graph showing the results of measuring the particles within the air stream in the measuring points shown in FIG. 12 under the installing conditions C (comparative apparatus) and D (apparatus of the present invention) shown in FIG. 13. As seen from the graph, particles were found to enter the housing section and a large number of particles were detected in each of the comparative apparatus (C) and the apparatus (D) of the present invention in the case where the cover of the indexer in the housing section was left open. Where the cover was closed, the number of particles was found smaller in each of the comparative apparatus (C) and the apparatus (D) of the present invention. However, the decrease in the number of the detected particles was found to be prominent in the apparatus of the present invention, indicating that the particles were discharged satisfactorily from within the apparatus body. Further, a tendency similar to that in FIG. 14 was recognized when it comes to the transfer section and the inspecting section. Specifically, the particles were found to have been discharged substantially completely from the apparatus (D) of the present invention, with the result that the number of particles remaining within the apparatus was very small.

Figure 16B:
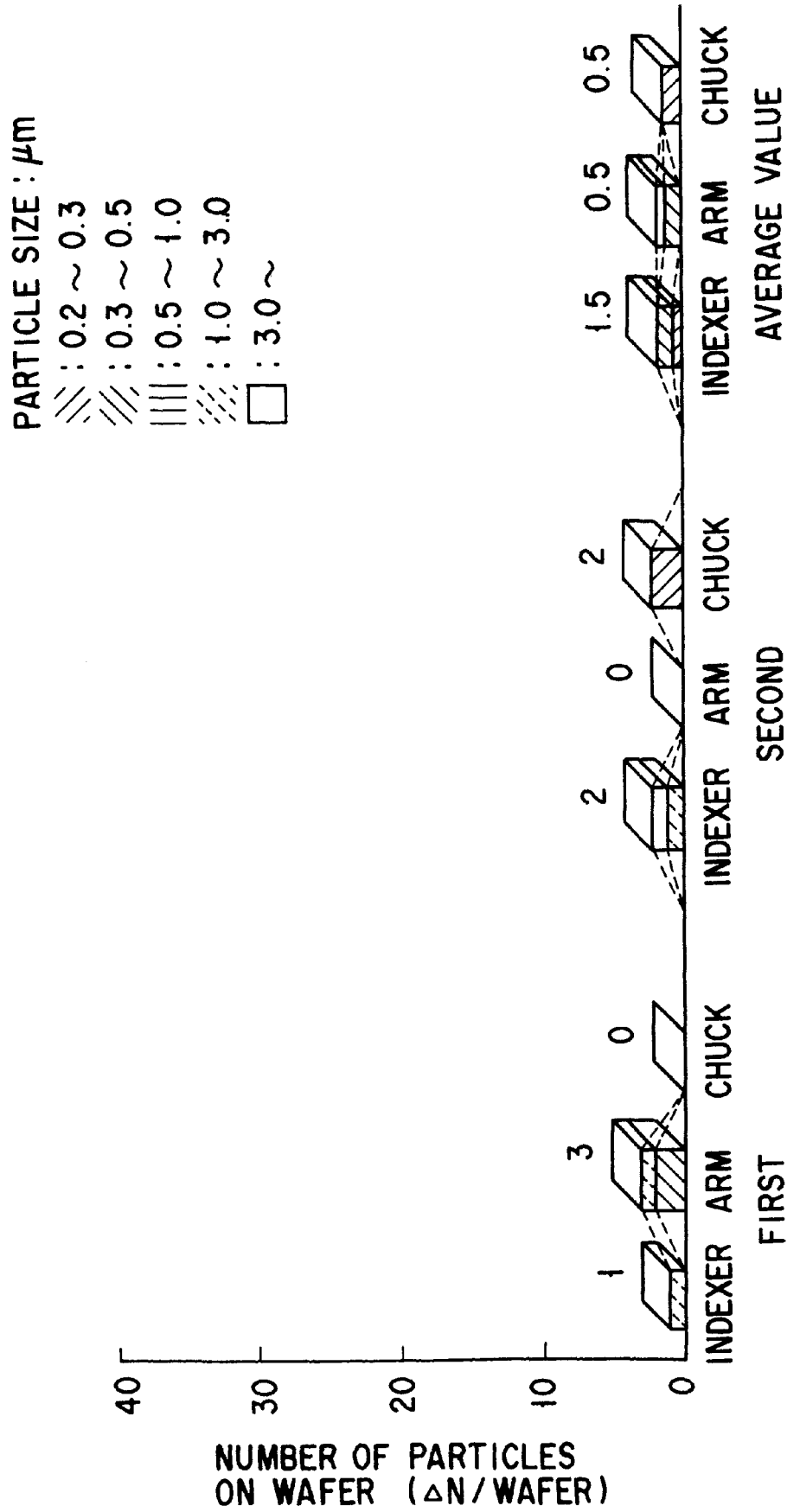

FIGS. 16A and 16B show the results of measuring the number of particles attached to the semiconductor wafer, covering the cases where a semiconductor wafer was left for 12 hours on each of the indexer (housing section), arm or fork (transfer section) and wafer chuck (inspecting section) under the installing conditions A and B, respectively, shown in FIG. 13. The particles were measured twice for each of the comparative apparatus (A) and the apparatus (B) of the present invention, and the average values thereof are shown in each of FIGS. 16A and 16B. As apparent from comparison between FIG. 16A (comparative apparatus) and FIG. 16B (present invention), the number of particles attached to the semiconductor wafer in any of the housing section, transfer section and inspecting section is markedly smaller in the apparatus of the present invention than that in the conventional apparatus. In other words, the experimental data clearly support that the particles in any of the sections are effectively discharged to the outside when it comes to the apparatus of the present invention, with the result that the particles are scarcely attached to the semiconductor wafer.

Figure 17:
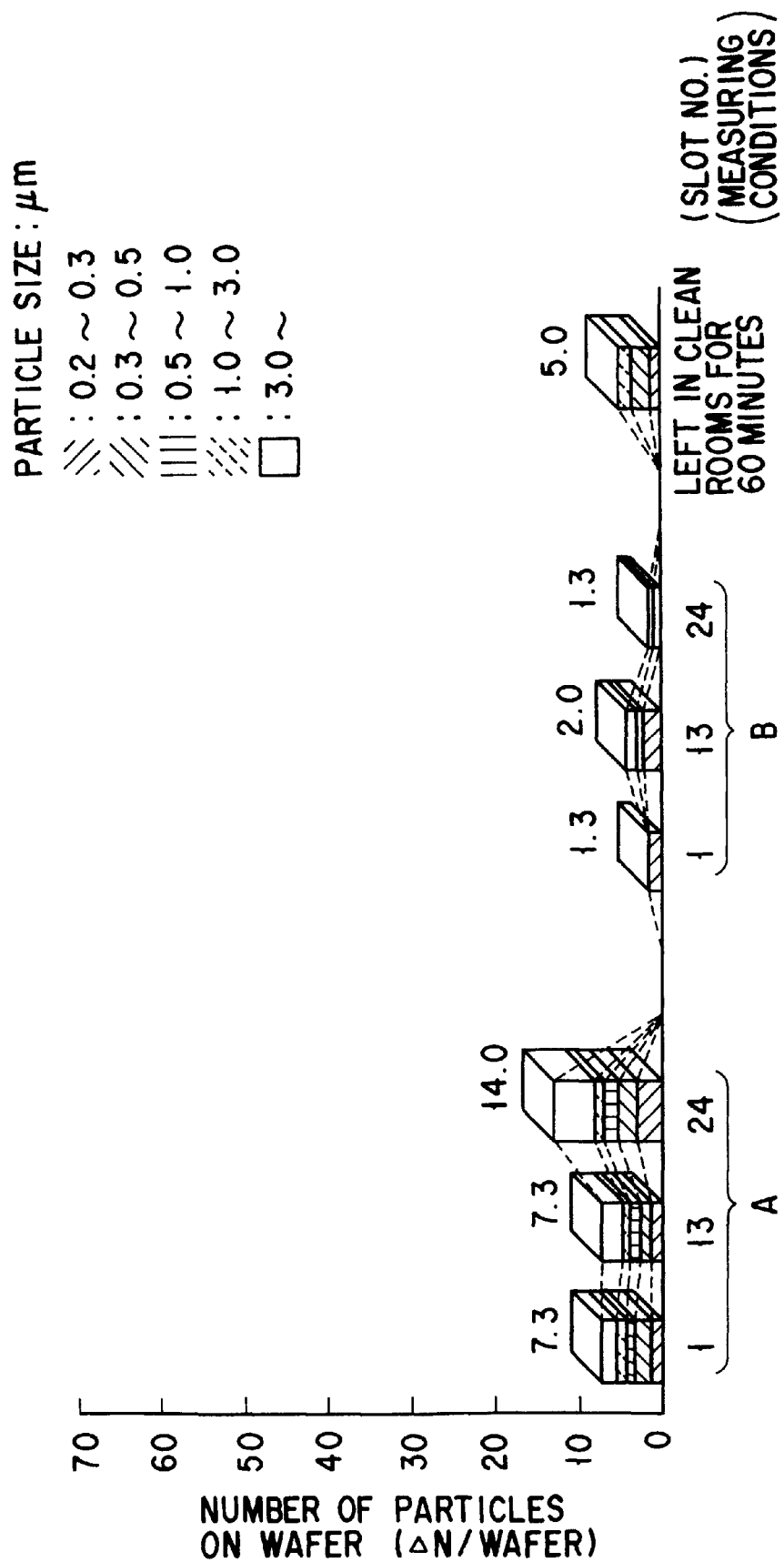
FIG. 17 is a graph showing the result of measurement of the particles attached to semiconductor wafers in the slots of a cassette in the case of driving the inspecting apparatus under installing conditions A and B shown in FIG. 13.

FIG. 17 covers the particle attachment to the semiconductor wafers within the cassette under the installing conditions A (comparative apparatus) and B (present invention) shown in FIG. 13. Specifically, 25 wafers were successively taken out of the cassette for each installing state so as to measure the number of particles attached to the wafer, followed by bringing the wafers back into the cassette. Then, the number of particles attached to each of the wafers in slot numbers 1, 13 and 24 of the cassette was counted again twice. The average values of the measurements are shown in FIG. 17. For comparison, a semiconductor wafer was also left in the clean room for 60 minutes, and the number of particles attached to the wafer was counted. The result is also shown in FIG. 17. It is clearly seen that the number of particles attached to the wafer is considerably smaller in the apparatus of the present invention (installing condition B) than that in the comparative apparatus (installing condition A). In addition, the particle attachment is substantially irrelevant to the location within the cassette in the apparatus of the present invention. Further, the particle attachment in the apparatus of the present invention is smaller than in the clean room.

Figure 18:
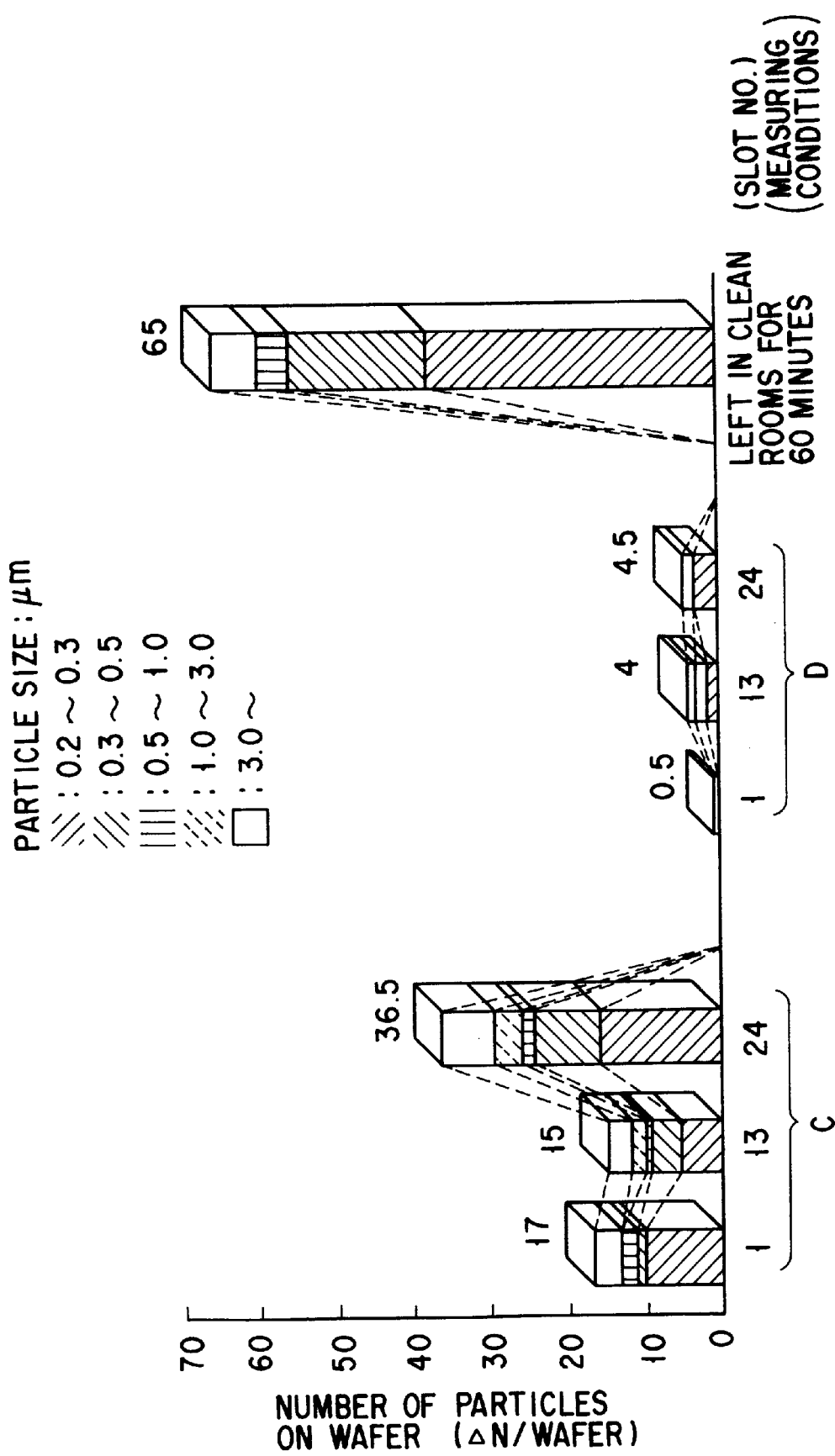
FIG. 18 is a graph showing the result of measurement of the particles attached to semiconductor wafers in the slots of a cassette in the case of driving the inspecting apparatus under installing conditions C and D shown in FIG. 13.

FIG. 18 covers an experiment similar to that for FIG. 17, except that the measurement was performed under the installing conditions C (comparative apparatus) and D (present invention). The experimental data support that the effect produced by the apparatus of the present invention is rendered particularly prominent with decrease of the cleanness in the clean room.

The present invention is not restricted at all by the embodiments described herein with reference to the accompanying drawings. In short, the technical scope of the present invention covers any type of the inspecting apparatus as far as the apparatus comprises an air blowing means, which is mounted to one side wall of the apparatus body, for forming a horizontal air stream within the apparatus body and an exhaust means, which is mounted to the opposite side wall, for discharging the horizontal air stream to the outside of the apparatus body.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrical inspecting apparatus, comprising:
   an apparatus body having a housing section for housing at least one semiconductor wafer to be inspected, an inspecting section provided with inspecting means for applying an electrical inspection to said object, and a transfer section provided with a transfer mechanism for transferring the wafer between said housing section and said inspecting section;
   air-blowing means mounted on said apparatus body for blowing air in a lateral direction into at least one of the housing section, inspecting section and transfer section to prevent particles from adhering to said wafer; and
   exhaust means mounted on the apparatus body for discharging the air flowing through at least one of said sections to the outside of the apparatus body.

2. The electrical inspecting apparatus according to claim 1, wherein said housing section, inspecting section and transfer section are arranged side by side within the apparatus body, and air is blown by said air-blowing means in a lateral direction into said three sections.

3. The electrical inspecting apparatus according to claim 2, wherein said apparatus body comprises a partition wall mounted to separate said housing section and transfer section from said inspecting section, and said air-blowing means comprises a first air-blowing member for blowing air in a lateral direction into the housing section and the transfer section and a second air-blowing member for blowing air in a lateral direction into said inspecting section.

4. The electrical inspecting apparatus according to claim 3, wherein said first and second air-blowing members include first and second fan filters, respectively, which are arranged side by side along one side of said apparatus body in a manner to blow air toward the opposite side of the apparatus body.

5. The electrical inspecting apparatus according to claim 3, wherein said exhaust means includes a first exhaust section for discharging the air flowing through said housing section and transfer section to the outside of the apparatus body and a second exhaust section for discharging the air flowing through said inspecting section to the outside of the apparatus body, said first and second exhaust sections include exhaust ducts joined to each other at right angles.

6. The electrical inspecting apparatus according to claim 3, wherein said first and second air-blowing members blow air at different blowing speed.

7. An electrical inspecting apparatus, comprising:
   an apparatus body having a housing section for housing a cassette in which a plurality of semiconductor wafers are housed a predetermined distance apart from each other in a vertical direction, the front and rear ends of said cassette being open, an inspecting section including a table on which one of said wafers is disposed and inspecting means for electrically inspecting said one wafer on the table, and a transfer section including a transfer mechanism for transferring a wafer between the housing section and the inspecting section, said transfer section being arranged rearward of said housing section, and said inspecting section being arranged sideward of the transfer section;
   air-blowing means mounted on said apparatus body for blowing air in a lateral direction into said housing section, inspecting section and transfer section to prevent particles from adhering to said wafer; and
   exhaust means mounted on the apparatus body for discharging the air flowing through said sections to the outside of the apparatus body.

8. The electrical inspecting apparatus according to claim 7, wherein said apparatus body includes a housing having an upper wall extending over said cassette and transfer mechanism to cover the cassette and transfer mechanism, and defining therein said housing section and transfer section, and a lid extending over said table to cover the table, the upper wall of the housing having an open portion above the cassette such that air is introduced through said open portion into the housing section.

9. The electrical inspecting apparatus according to claim 8, wherein said apparatus body includes a partition wall mounted to separate said housing section and transfer section from said inspecting section, said air-blowing means comprises a first air-blowing member arranged in a front region of the apparatus body for blowing air in a lateral direction into the housing section and the transfer section and a second air-blowing member arranged in a front region of the apparatus body for blowing air in a lateral direction into said inspecting section, and said exhaust means includes a first exhaust section for discharging the air flowing through said housing section and transfer section to the outside of the apparatus body and a second exhaust section for discharging the air flowing through said inspecting section to the outside of the apparatus body, said first and second exhaust sections include exhaust ducts joined to each other at right angles.

10. The electrical inspecting apparatus according to claim 9, further comprising additional air-blowing means arranged in the vicinity of the table for blowing air obliquely downward toward the upper surface of the table.

11. The electrical inspecting apparatus according to claim 9, further comprising a guide rail mounted in the vicinity of said table, an alignment bridge partly in contact with said guide rail and moving along the guide rail to perform wafer alignment, and a cover for covering the contact portion between the alignment bridge and the guide rail.

12. The electrical inspecting apparatus according to claim 9, wherein said table includes a hot chuck capable of heating a semiconductor wafer and having an upper surface on which said wafer is disposed, and a windbreak cover mounted in a front region of said hot chuck for inhibiting an air stream from flowing along the upper surface of the hot chuck.

13. The electrical inspecting apparatus according to claim 9, wherein said housing and lid have roundish inner corner portions.

14. The electrical inspecting apparatus according to claim 9, wherein a ring-like air flow-smoothing member having a thickness gradually increasing from the outermost circumference toward the innermost circumstance is mounted to cover the circumferential side surface of said table.

15. A combined system, comprising:

an electrical inspecting apparatus including an apparatus body having a housing section for housing at least one semiconductor wafer to be inspected, an inspecting section provided with inspecting means for applying an electrical inspection to said object, and a transfer section provided with a transfer mechanism for transferring the wafer between said housing section and said inspecting section; first air-blowing means mounted in said apparatus body for blowing air in a horizontal direction into at least one of the housing section, inspecting section and transfer section for preventing particles from adhering to said wafer; and exhaust means mounted to the apparatus body for discharging the air flowing through at least one of said sections to the outside of the apparatus body;

a clean booth arranged within a clean room for housing said electrical inspecting apparatus in a manner to isolate the apparatus from the clean room, said clean booth having a ceiling and a second air-blowing means arranged in said ceiling for blowing air downwardly into the apparatus body;

means connected between the exhaust means of the electrical inspecting apparatus and the second air-blowing means of the clean booth for blowing air from said exhaust means into said second air-blowing means; and filter means for removing particles from the air coming from the exhaust means.

* * * * *